United States Patent [19]

Meuleman et al.

[11] Patent Number: 4,677,634
[45] Date of Patent: Jun. 30, 1987

[54] DOUBLE HETEROJUNCTION SEMICONDUCTOR LASER HAVING IMPROVED HIGH-FREQUENCY CHARACTERISTICS

[75] Inventors: Lambertus J. Meuleman; Adriaan Valster, both of Eindhoven, Netherlands

[73] Assignee: U.S. Philips Corporation, New York, N.Y.

[21] Appl. No.: 714,228

[22] Filed: Mar. 21, 1985

[30] Foreign Application Priority Data

Apr. 12, 1984 [NL] Netherlands ............... 8401172

[51] Int. Cl.$^4$ ................................. H01S 3/19
[52] U.S. Cl. .................................. 372/46; 372/48
[58] Field of Search ................. 372/46, 48; 357/17

[56] References Cited

U.S. PATENT DOCUMENTS 4,525,841 6/1985 Kitamura et al. ............ 372/48

FOREIGN PATENT DOCUMENTS 0198785 11/1984 Japan ............................ 372/46

Primary Examiner—James W. Davie
Attorney, Agent, or Firm—Robert T. Mayer; Steven R. Biren

[57] ABSTRACT

A semiconductor laser of the double heterojunction (DH) type having a current-confining buried blocking layer. According to the invention, a high-resistance region having a disturbed crystal structure is present outside and on either side of the strip-shaped active region and extends at least throughout the thickness of the blocking layer. As a result, the lateral leakage currents and the parasitic capacitances are reduced so that the laser can be used at frequencies considerably higher than 1 GHz. The high-resistance region is preferably obtained by protron bombardment. The invention is particularly advantageous in DCPBH lasers for optical communication.

5 Claims, 7 Drawing Figures

DOUBLE HETEROJUNCTION SEMICONDUCTOR LASER HAVING IMPROVED HIGH-FREQUENCY CHARACTERISTICS

BACKGROUND OF THE INVENTION

The invention relates to a semiconductor laser comprising a semiconductor body having a substrate of a first conductivity type and a layer structure provided on it, said layer structure comprising successively at least a first passive layer of the first conductivity type, a second passive layer of the second opposite conductivity type and an active layer located between said first and second passive layers and having a pn junction which at a sufficiently high current strength in the forward direction generates coherent electromagnetic radiation in a strip-shaped active region of the active layer located inside a resonant cavity. The first and second passive layers have a lower refractive index for the generated radiation and a larger band gap than the active layer, and a current-confinement blocking layer is provided which has a strip-shaped interruption at the area of the active region, the second passive layer and the substrate being electrically connected to connection conductors.

A semiconductor laser of the kind described is known from U.S. Pat. No. 3,984,262.

In semiconductor pn lasers, more particularly in lasers of the double heterojunction type (so-called pH lasers), different constructions are in use in order to ensure that the pumping current remains confined to the strip-shaped active part of the laser structure in which the coherent radiation is generated, in order to obtain the desired laser action at the lowest possible threshold current and to prevent overheating.

According to the simplest method, it is ensured that one of the electrodes is in contact only with a strip-shaped part of the laser surface and outside this region is separated from the semiconductor surface by an insulating layer of, for example, silicon oxide. However, in this construction the distance between the electrode and the active layer is fairly large and current spreading occurs over this distance.

In another known method, a high resistance region is formed outside the strip-shaped active region of the laser, this high-resistance region extending from the surface to the proximity of the active layer or, if desired, even through this layer. Such a high resistance region, which effectively confines the current to the active part of the semiconductor laser, is generally formed by a proton bombardment, which disturbs the crystal structure and hence considerably increases the electrical resistance. This method is described in U.S. Pat. No. 3,824,133. However, this method has the disadvantage that expensive equipment is required for carrying out such a proton bombardment and that this bombardment is a fairly laborious operation.

In order to obviate the above disadvantages, a third method has been developed, which is described in the aforementioned U.S. Pat. No. 3,984,262 and consists of including in the crystal structure in the proximity of the active layer a buried blocking layer, which may consist of high resistance material or of semiconductor material of such a conductivity type that the blocking layer forms a pn junction with the adjoining semiconductor material. In the operating condition this pn junction may be biased in the reverse direction or may be biased in the forward direction in a manner such that no or substantially no current flows through the pn junction. Such a blocking layer can be formed in a simple manner, for example by diffusion or ion implantation or by epitaxial growth, and provides an excellent current confinement. Lasers of this construction, especially the more advanced versions thereof, such as the DCPBH (Double Channel Planar Buried Hetero) laser described inter alia in Electronics Letters, Oct. 28, 1982, Volume 18, No. 22, p. 953–954, are therefore particularly suitable for many applications.

In important fields of application, such as optical communication, it is required to cause the laser to operate at a very high modulation frequency, for example at 1 GHz or higher. Although the aforementioned lasers having a current-confining blocking layer have proved to operate satisfactorily in other respects, at these high frequencies problems arise which become manifest in a serious limitation of the modulation bandwidth.

SUMMARY OF THE INVENTION

The invention has inter alia for its object to avoid or at least considerably reduce these problems and thus to produce semiconductor lasers with blocking layer current confinement suitable for use at very high modulation frequencies ($>1$ GHz).

The invention is based inter alia on the recognition of the fact that this object can be achieved by a final treatment to which the known semiconductor laser which blocking layer current confinement has to be subjected.

According to the invention, a semiconductor laser of the kind described above in the first paragraph is characterized in that a high resistance region having a disturbed crystal structure extends outside and on either side of the strip-shaped active region from the side of the semiconductor body located opposite the substrate at least throughout the thickness of the blocking layer.

This measure seems incompatible with the aim described above to avoid in current-confining measures the use of complicated techniques which increase the cost. Moreover, since by means of a buried blocking layer a satisfactory current confinement is obtained, it seems wholly superfluous to provide in addition a high resistance region having a disturbed crystal structure, for instance by a proton bombardment or by any other means.

However, it has been found that this additional and seemingly superfluous measure results in that the lasers thus obtained still operate satisfactorily at frequencies far above 1 GHz. This unexpectedly favorable result presumably at least to a considerable extent is due to the fact that the abovementioned problems at high frequencies are mainly caused by the capacitance formed by the blocking layer together with the adjoining semiconductor material in combination with parasitic lateral leakage currents in the structure.

The high-ohmic region having a disturbed crystal structure can be obtained by means of a bombardment with high velocity particles, preferably protons. The blocking layer may consist of a layer of electrically insulating or at least high resistance material, but preferably consists of a semiconductor layer which forms with the adjoining semiconductor material a pn junction which in the operating condition is biased in the reverse direction.

Advantageously, the strip-shaped active region is laterally bounded by a boundary region of the second conductivity type having a lower refractive index for the radiation produced and a larger band gap than the active region. As a result, the radiation is also laterally confined to the strip-shaped active region.

According to a preferred embodiment particularly suitable for use in the optical communication technique, the strip-shaped active region is defined by two grooves which extend from the upper side of the second passive layer through the active layer into the first passive layer and are filled at least in part by the said boundary region and the blocking layer of the first conductivity type provided thereon.

BRIEF DESCRIPTION OF THE DRAWING

The invention will now be described in more detail with reference to several embodiments and the drawing, in which.

Figure 1:
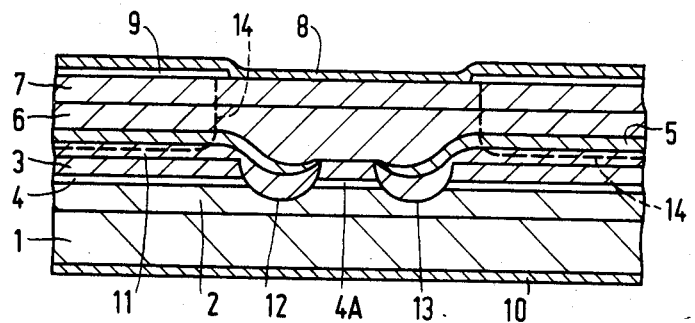
FIG. 1 shows diagrammatically in cross-section a semiconductor laser according to the invention.

The Figures are not drawn to scale. For the sake of clarity, more particularly the dimensions in the vertical direction are strongly exaggerated. Corresponding parts are generally designated by the same reference numerals and regions of the same conductivity type in cross-section are generally hatched in the same direction.

DESCRIPTION OF THE PREFERRED EMBODIMENTS

FIG. 1 shows diagrammatically in cross-section a semiconductor laser according to the invention. The laser comprises a semiconductor body having a substrate 1 of indium phosphide (InP) of a first, in this case n-conductivity type. On the substrate 1 is disposed a layer structure comprising a first passive layer 2 of n-type indium phosphide, a second passive layer 3 of the second opposite, in this case p-conductivity type, and also of indium phosphide and between the layers 2 and 3 an active layer 4. This active layer 4 is of indium gallium arsenide phosphide (composition $In_xGa_{1-x}As_yP_{1-y}$). When the values of x and y are varied, the wavelength of the radiation produced can be varied between about 1.2 $\mu m$ and 1.6 $\mu m$. In this example, $x=0.73$ and $y=0.63$, while the layer 4 is not intentionally doped.

The layer 4 has a pn junction which, dependent upon the conductivity type of the layer 4, is situated between this layer and one of the layers 2 and 3. This pn junction can generate coherent electromagnetic radiation in a strip-shaped active region 4A of the active layer 4 at a sufficiently high current strength in the forward direction. This strip-shaped region 4A extends in FIG. 1 at right angles to the plane of the drawing and is located inside a resonant cavity which is formed by two mirror surfaces which are arranged at right angles to the active region 4A and take the form of cleavage surfaces of the crystal (not visible in FIG. 1). At the saie values of x and y, the emitted wavelength in vacuo is about 1.3 $\mu m$. The first passive layer 2 and the second passive layer 3 both have a lower refractive index for the generated radiation and a larger band gap than the active layer 4.

The laser further comprises a current-confining blocking layer 5, which has a strip-shaped interruption at the area of the active region 4A. The second passive layer 3—at least the part thereof not covered by the blocking layer 5—is electrically connected (in this example via a highly doped layer 6 of p-type InP and a highly doped layer 7 disposed thereon of p-type $In_xGa_{1-x}As_yP_{1-y}$ with $x=0.79$ and $y=0.49$) to a connection conductor in the form of a metal electrode layer 8, which in this example is moreover separated by an insulating layer 9 of silicon oxide from the non-active part of the laser. The substrate 1 is provided on the lower side with an electrode layer 10.

Furthermore, in this example there is present a boundary region 11 in the form of a p-type layer of InP having a lower refractive index for the generated radiation and a larger band gap than the active layer 4. The strip-shaped active region 4A is moreover defined by two grooves 12 and 13, which extend from the upper side of the second passive layer 3 through the active layer 4 into the first passive layer 2 and are filled at least in part by the said boundary region 11 and the blocking layer 5 disposed thereon. The boundary region 11 and the grooves 12 and 13 are not absolutely necessary for the invention. However, they favor to a considerable extent the current confinement and the confinement of the radiation to the active region 4A.

The semiconductor laser described so far is known from the aforementioned article in Electronics Letters of Oct. 28, 1982, p. 953-954. This laser is particularly suitable to be used as a radiation source for optical communication.

A disadvantage of this laser and of other laser structures having a blocking layer, however, is that at very high frequencies parasitic capacitances and currents have a very disturbing effect, as a result of which the modulation bandwidth of these lasers is seriously limited. The parasitic capacitances are more particularly constituted by the capacitance of the blocking layer 5 and in this example also by the capacitance of the electrode layer 8 and the oxide layer 9. In this example, the blocking layer 5 consists of n-type InP so that two pn junctions are formed, i.e. one between the layers 5 and 6 and one between the layers 5 and 11. These pn junctions yield a comparatively large parasitic capacitance. The lateral resistance of the layers 6 and 7 together with the said parasitic capacitances form RC combinations which reduce considerably the impedance level of the non-active part of the laser and hence adversely affect the high-frequency behavior.

According to the invention, a high resistance region 14 having a disturbed crystal structure, whose boundaries are indicated in FIG. 1 by dotted lines, extends from the side of the semiconductor body located opposite to the substrate 1 at least throughout the thickness of the blocking layer 5 on either side of the strip-shaped active region 4A. The region 14 in this example is obtained by a proton bombardment and increases considerably the impedance level of the non-active part of the laser. This results in that the laser can be used up to frequencies far above 1 GHz and thus has become a suitable radiation source for broadband optical communication systems.

Figure 2:
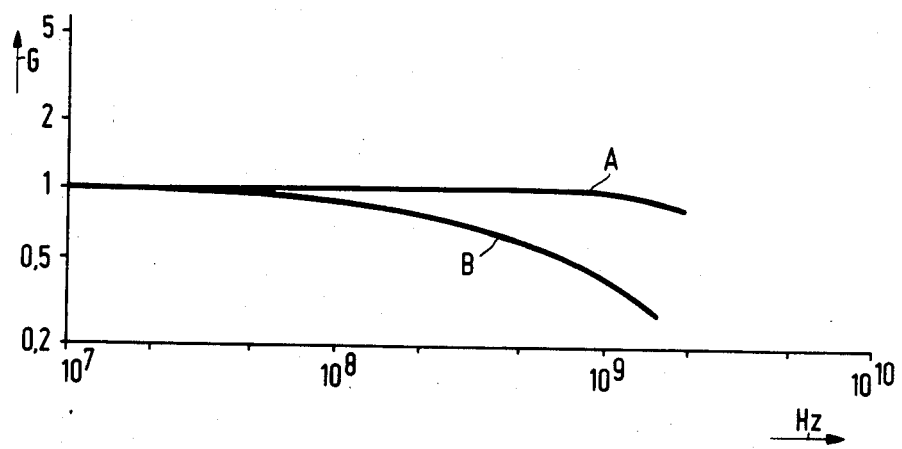
FIG. 2 shows the modulation sensitivity of the laser of FIG. 1 (curve A) as compared with that of the same laser without high-ohmic regions 14 (curve B)

By way of example, in FIG. 2 curve A indicates the modulation sensitivity G as a function of the frequency for a semiconductor laser of the structure described above and curve B indicates this sensitivity for the same semiconductor laser in the absence of the regions 14. The term modulation sensitivity G is to be understood to mean, as usual, the variation in the emitted power as a function of a variation in the pumping current. G is plotted logarithmically (in arbitrary units) in FIG. 2. It can be seen clearly that, where the laser without the high-resistance regions 14 has a considerably reduced modulation sensitivity above 100 MHz, this sensitivity remains substantially constant in the laser according to the invention up to frequencies in the proximity of 2 GHz.

Figure 3:
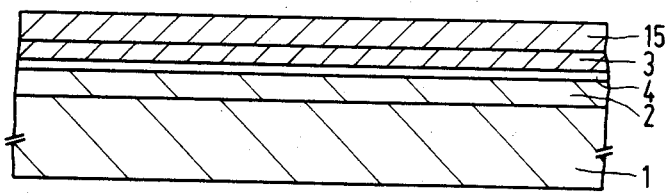
FIGS. 3 to 5 show diagrammatically in cross-section successive stages in the manufacture of the laser shown in FIG. 1.
Figure 4:
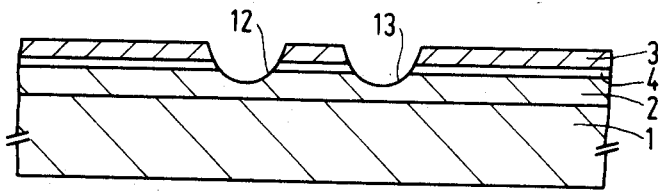
Figure 5:
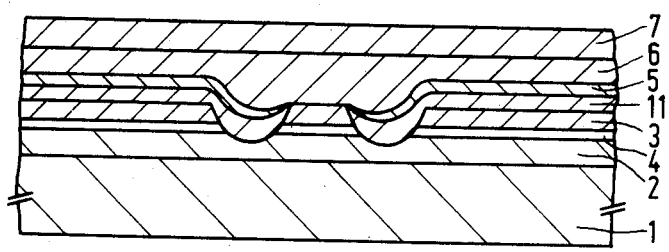

The semiconductor laser described can be manufactured in the manner shown in FIGS. 3 to 5.

The starting material is a substrate 1 of n-type indium phosphide having a thickness of about 360 $\mu$m, a (100) orientation and a carrier concentration of, for example, $5.10^{18}$ per $cm^3$ (see FIG. 3).

On this substrate are successively grown in a usual manner, for example by liquid phase epitaxy (LPE) a layer 2 of n-type indium phosphide having a thickness of about 3 $\mu$m and a doping concentration of $2.10^{18}$ tin atoms/$cm^3$, an active layer 4 having the composition $In_{0.73}Ga_{0.27}As_{0.63}P_{0.37}$ and a thickness of 0.15 $\mu$m which is not intentionally doped, a layer 3 of p-type indium phosphide having a thickness of 1 $\mu$m and a doping concentration of $2.10^{18}$ zinc atoms/$cm^3$ and a p-type covering layer 15 having the composition $In_{0.79}Ga_{0.21}As_{0.49}P_{0.51}$ and a Zn doping of $5.10^{18}$ atoms/$cm^3$ (see FIG. 3).

The assembly is then removed from the growing apparatus. The covering layer 15 then serves to prevent the evaporation of phosphorous from the layer 3 while at high temperature. After cooling of the layer structure, the covering layer 15 is removed, for example by etching with a mixture of concentrated sulphuric acid and $H_2O_2$ 30%. Subsequently, grooves 12 and 13 are etched into the surface of the layer 3 by means of usual photolithographic techniques with the use of, for example, methanol bromide as etchant. At the upper side the grooves have a width of about 9 $\mu$m and a depth of 3 $\mu$m. The mesa lying between the grooves at its upper side has a width of about 1.5 $\mu$m.

The assembly is then placed again in the growing apparatus. First a p-type indium phosphide layer 11 having a doping of $8.10^{17}$ Zn atoms/$cm^3$ is grown, on which is grown an n-type indium phosphide layer 5 (the blocking layer), having a doping of $8.10^{17}$ germanium atoms/$cm^3$. On the flat part of the structure outside the grooves 12,13 and the mesa, these layers have a thickness of about 0.5 $\mu$m. They partly fill the grooves, but do not grow on the mesa. Subsequently, a p-type indium phosphide layer 6 having a thickness of 1 $\mu$m and a doping concentration of $8.10^{17}$ Zn atoms/$cm^3$ and a p-type layer 7 having the composition $In_{0.79}Ga_{0.21}As_{0.49}P_{0.51}$, a thickness of 1 $\mu$m and a doping concentration of $2.10^{18}$ Zn atoms/$cm^3$ are grown. Thus, the structure of FIG. 5 is obtained.

If desired, an oxide layer 9 is now formed, in which a strp of 10 $\mu$m width, which leaves free the region above the grooves and the intermediate region, is etched. In order to establish a good ohmic contact, zinc is diffused into this strip. Subsequently, the surface of the strip is provided by means of known photolithographic methods with a gold mask having a thickness of about 2.5 $\mu$m. By a proton bombardment with a dose of $3.10^{15}$ protons/$cm^2$ and at an energy of 320 keV, the regions 14 are then formed. Finally, by etching, the thickness of the substrate 1 is reduced to about 80 $\mu$m, after which the metal layers 0 and 10 are provided at the cleavage surfaces serving as mirror surfaces are obtained by scribing and breaking. The semiconductor laser can then be finished in a usual manner.

Instead of by a proton bombardment, the regions 14 may also be obtained by a bombardment with other high velocity particles, such as, for example, deuterium ions or helium ions. The regions 14 may also extend over a larger depth than in this embodiment, for example through the active layer 4 into the first passive layer 2, depending upon the implantation energy.

The presence of the oxide layer 9 is not necessary because the regions 14 are very high resistance and so substantially do not give rise to current spreading.

The blocking layer 5 may be a lever of electrically insulating material or a very high resistance layer, for instance obtained by ion implantation, instead of an n-type layer.

The invention may be used not only in the laser structure described above, but may be advantageous in a general sense in all laser structures in which current confinement is obtained by means of a buried blocking layer. By way of example, FIGS. 6 and 7 show cross-sections of two other known semiconductor lasers having a blocking layer 5 provided with a high resistance region 14 according to the invention.

Figure 6:
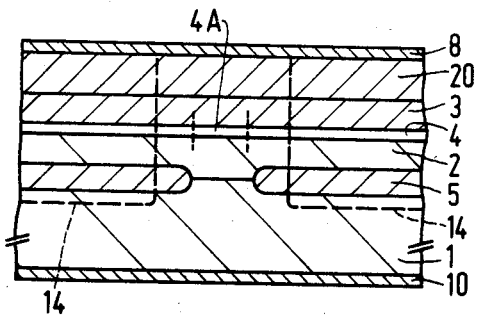
FIGS. 6 and 7 show diagrammatically in cross-section other semiconductor lasers according to the invention.

FIG. 6 shows diagrammatically in cross-section a semiconductor laser according to U.S. Pat. No. 3,984,262 provided with a high resistance region 14 having a disturbed crystal structure for improviding the high-frequency behavior according to the invention. The substrate 1 in this case consists of n-type gallium arsenide, while the first passive layer 2 consists of n-type $Al_xGa_{1-x}As$, the active layer 4 of GaAs, the second passive layer 3 of p-type $Al_xGa_{1-x}As$ and the top layer 20 of p-type GaAs. The blocking layer 5 consists of p-type GaAs.

Figure 7:
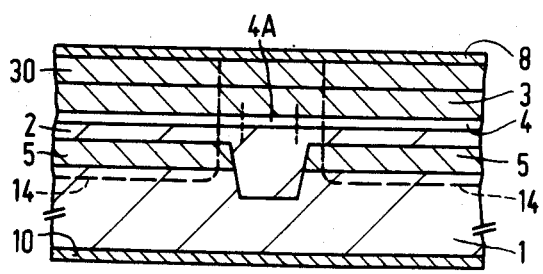

FIG. 7 shows in cross-section another frequently-used semiconductor laser structure comprising a substrate 1 of p-type GaAs, a first passive layer 2 of p-type $Al_xGa_{1-x}As$, an active layer 4 of GaAs, a second passive layer 3 of n-type $Al_xGa_{1-x}As$ and a top layer 30 of n-type GaAs. The blocking layer 5 consists of n-type GaAs. Also in this case, a high resistance region 14 having a disturbed crystal structure extends throughout the thickness of the blocking layer 5 into the substrate 1.

It should further be noted that the layer structure can be varied in many ways. Furthermore, especially the blocking layer and also other layers may consist of several juxtaposed sublayers, while intermediate layers in the form of buffer layers may be added for various technological and/or electrical purposes. The conductivity types of the various semiconductor layers may all be replaced (simultaneously) by the opposite conductivity types and the semiconductor materials and doping concentrations used may be varied according to desire by those skilled in the art, depending upon the application and the frequency of the radiation to be generated.

Although in the embodiments described herein, the resonant cavity is formed by cleavage surfaces of the crystal, the invention may also be used in lasers having differently formed resonant cavities, for example DFB ("Distributed Feedback") or DBR ("Distributed Bragg Reflector") lasers.

What is claimed is:

1. A semiconductor laser comprising a semiconductor body having a substrate of a first conductivity type and a layer structure provided thereon, said layer structure comprising successively at least a first passive layer of the first conductivity type, a second passive layer of the second opposite conductivity type and an active layer having a strip-shaped active region and being located between said first and second passive layers and having a pn junction which at a sufficiently high current strength in the forward direction generates coherent electro-magnetic radiation in the strip-shaped active region of the active layer, the first and second passive layers having a lower refractive index for the generated radiation and a larger band gap that that of the active layer, a current-limiting blocking layer which has a strip-shaped interruption at the area of the active region, and connection conductors electrically connected to the second passive layer and the substrate, characterized in that a high resistance region having a disturbed crystal structure extends outside and on either side of the strip-shaped active region from the side of the semiconductor body located opposite the substrate at least throughout the thickness of the blocking layer.

2. A semiconductor laser as claimed in claim 1, characterized in that the high-resistance region having a disturbed crystal structure is a region obtained by proton bombardment.

3. A semiconductor laser as claimed in claim 1 or 2, characterized in that the blocking layer is a semiconductor layer which forms a pn junction with the adjoining semiconductor material.

4. A semiconductor laser as claimed in claim 3, characterized in that the strip-shaped active region is laterally bounded by a boundary region of the second conductivity type having a lower refractive index for the generated radiation and a larger band gap than the active layer.

5. A semiconductor laser as claimed in claim 4, characterized in that the strip-shaped active region is defined by two grooves, which extend from the upper side of the second passive layer through the active layer into the first passive layer and are filled at least in part by the said boundary region and the blocking layer of the first conductivity type provided thereon.

* * * * *